United States Patent
Boivin et al.

(10) Patent No.: US 10,304,775 B2
(45) Date of Patent: May 28, 2019

(54) CONNECTING BAR

(71) Applicants: STMicroelectronics (Rousset) SAS, Rousset (FR); STMicroelectronics (Crolles 2) SAS, Crolles (FR)

(72) Inventors: Philippe Boivin, Venelles (FR); Delia Ristoiu, Saint Ismier (FR)

(73) Assignees: STMicroelectronics (Rousset) SAS, Rousset (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/700,960

(22) Filed: Sep. 11, 2017

(65) Prior Publication Data

US 2018/0211915 A1   Jul. 26, 2018

(30) Foreign Application Priority Data

Jan. 23, 2017   (FR) .................................... 17 50540

(51) Int. Cl.

| H01L 23/535 | (2006.01) |
|---|---|
| H01L 23/48 | (2006.01) |
| H01L 21/768 | (2006.01) |
| H01L 23/485 | (2006.01) |
| H01L 27/12 | (2006.01) |
| H01L 23/532 | (2006.01) |

(52) U.S. Cl.
CPC ...... *H01L 23/535* (2013.01); *H01L 21/76802* (2013.01); *H01L 21/76879* (2013.01); *H01L 21/76895* (2013.01); *H01L 23/481* (2013.01); *H01L 23/485* (2013.01); *H01L 27/1203* (2013.01); *H01L 21/76807* (2013.01); *H01L 23/53257* (2013.01)

(58) Field of Classification Search
CPC ................. H01L 23/535; H01L 23/481; H01L 21/76802; H01L 21/76879; H01L 23/53257; H01L 27/1203
See application file for complete search history.

(56) References Cited

U.S. PATENT DOCUMENTS

| 6,163,067 A | * | 12/2000 | Inohara ............. H01L 21/76801 257/635 |
| 2005/0250315 A1 | * | 11/2005 | Tran ..................... H01L 21/7681 438/637 |
| 2006/0094219 A1 | * | 5/2006 | Soda .................. H01L 21/02074 438/597 |

(Continued)

FOREIGN PATENT DOCUMENTS

WO   WO-2016130350 A1   8/2016

OTHER PUBLICATIONS

INPI Search Report and Written Opinion for FR 1750540 dated Oct. 10, 2017 (8 pages).

*Primary Examiner* — Feifei Yeung Lopez
(74) *Attorney, Agent, or Firm* — Crowe & Dunlevy

(57) ABSTRACT

A connecting bar electrically connects separate circuit zones of an integrated circuit. The connecting bar is formed by a main portion that is a conductive strip extending above separate circuit zones to be interconnected. The conductive strip is separated from the integrated circuit by a dielectric except at the circuit zones to be interconnected. The connecting bar further includes secondary portions that are conductive pads passing through the dielectric in a vertical direction from the circuit zone to the conductive strip.

17 Claims, 3 Drawing Sheets

(56) References Cited

U.S. PATENT DOCUMENTS

2006/0240659 A1* 10/2006 Ryu .................. H01L 21/76877
    438/620
2008/0087932 A1    4/2008 Son et al.
2008/0239792 A1   10/2008 Wann et al.

* cited by examiner

CONNECTING BAR

PRIORITY CLAIM

This application claims the priority benefit of French Application for Patent No. 1750540, filed on Jan. 23, 2017, the disclosure of which is hereby incorporated by reference in its entirety to the maximum extent allowable by law.

TECHNICAL FIELD

The present application relates to the field of integrated circuits and more particularly to the production of a connecting bar forming an electrical connection between elements of an integrated circuit, for example between the sources of a plurality of transistors formed in a thin silicon-on-insulator (SOI) layer.

BACKGROUND

SOI transistors are alternatives to bulk silicon transistors. An SOI transistor is formed in and on a thin silicon layer separated from a silicon wafer by a layer of insulator, generally silicon dioxide.

It has been observed that, in many cases, SOI integrated circuits in which a connecting bar connects a plurality of elements of the circuit contain defects.

SUMMARY

Thus, one embodiment makes provision for a connecting bar comprising: a main portion consisting of a conductive strip extending above separate zones to be interconnected, the conductive strip being separated from any conductor by a dielectric, except in the zones to be interconnected; and secondary portions consisting of first conductive pads passing through the dielectric, each of these first pads extending vertically from one zone to be interconnected to the conductive strip.

According to one embodiment, the zones to be interconnected are source or drain zones of transistors of an integrated circuit.

According to one embodiment, the secondary portions are first pads that are similar to second pads for connecting the drain or source zones of the transistors, the first pads having smaller heights than the second pads.

According to one embodiment, the conductive strip and the conductive pads are made of tungsten.

One embodiment makes provision for a process for fabricating a connecting bar comprising: a) forming a main cavity extending above zones to be interconnected and being separated from the zones to be interconnected by a dielectric; b) forming secondary cavities, each extending vertically from a zone to be interconnected as far as to the main cavity; and c) filling the main and secondary cavities with a conductor.

According to one embodiment, step a) is carried out before or after step b).

According to one embodiment, step a) or step b) first comprises a step of etching an upper insulator of the structure then a step of etching an etch-stop layer with the pattern of said secondary cavities.

One embodiment makes provision for an integrated circuit comprising at least one connecting bar such as described in one of the preceding embodiments.

In an embodiment, an apparatus comprises: an integrated circuit including separate first circuit zones to be interconnected; and a connecting bar consisting of: a main portion formed by a conductive strip extending above said separate first circuit zones, the conductive strip being separated from the integrated circuit by a dielectric except at the separate first circuit zones to be interconnected; and secondary portions formed by first conductive pads passing through the dielectric, each of the first conductive pads extending vertically from one first circuit zone to the conductive strip.

BRIEF DESCRIPTION OF THE DRAWINGS

These features and advantages, and others, are described in detail in the following non-limiting description of particular embodiments, which description is given with reference to the appended figures, in which.

DETAILED DESCRIPTION

Elements that are the same have been referenced by the same references in the various figures and, in addition, the various figures have not been drawn to scale. For the sake of clarity, only those elements that are useful to the comprehension of the described embodiments have been shown and are detailed.

In the following description, when reference is made to qualifiers of position such as the terms "in front", "above", "upper", etc., or qualifiers of orientation such as the term "vertical", etc., reference is being made to the orientation of the element in question in the figures.

Figure 1:
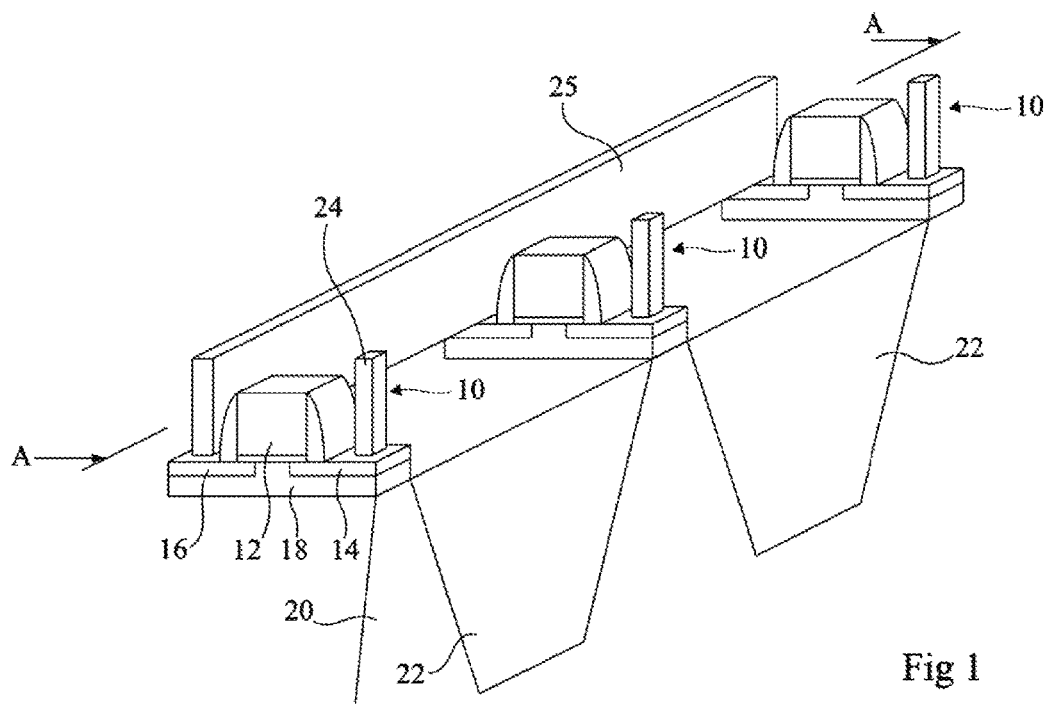
FIG. 1 is a partial schematic perspective view of three SOI transistors connected via their sources.

FIG. 1 is a partial schematic perspective view of three transistors 10 formed in and on a thin silicon-on-insulator (SOI) layer. Each of the transistors is formed in and on an active zone defined in the thin silicon layer. Each transistor comprises a gate 12, a drain zone 14 and a source zone 16. Each active zone rests on a layer 18 of insulator, called the BOX (for buried oxide), that is generally made of silicon dioxide. The layer 18 is itself formed on a silicon wafer 20.

In the particular case considered here, insulator-filled trenches 22 are formed in the silicon wafer 20 between each transistor and its neighbor transistors.

Conductive pads (contacts) 24 allow electrical connection to be made to the drain zones 14 of the transistors 10. The gate connections are not shown, but may similarly be made using conductive pads (contacts).

To electrically connect the source zones of the three transistors to one another, one solution consists in forming a connecting bar. FIG. 1 shows a vertical conductive strip 25 formed in physical and electrical contact with the three source zones to be electrically connected and constituting a connecting bar.

Figure 2A:
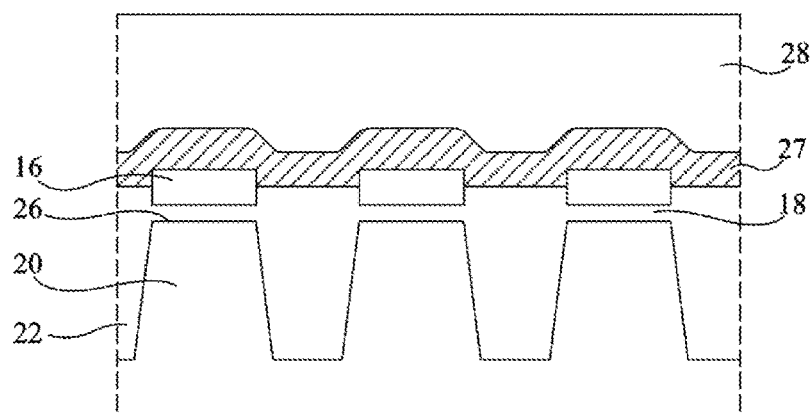
FIGS. 2A and 2B are cross-sectional views illustrating steps of forming a connection common to three transistors.
Figure 2B:
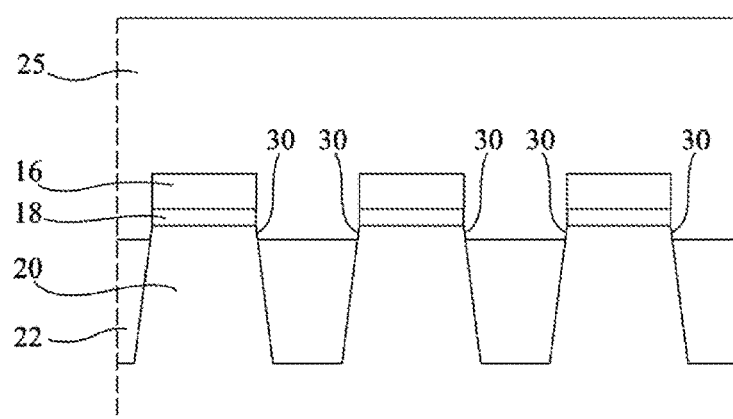

FIGS. 2A and 2B are cross-sectional views illustrating steps of a process for fabricating the connecting bar 25 schematically illustrated in FIG. 1. These views are of a plane A-A orthogonal to the source zones of the transistors 10.

FIG. 2A is a cross-sectional view of three SOI transistors 10 that are not yet electrically connected at their source zones. In the wafer 20, the insulator-filled trenches 22 have been formed, for example at equal distance from one another, leaving un-etched sections 26 of wafer 20 under the active zones 16 (it will be noted that FIG. 1 on the one hand and FIGS. 2A and 2B on the other hand have not been drawn to the same scale). The wafer 20, including the sections 26, is covered with an insulator 22. The insulator 22 is covered with a thin layer 27 of etch-stop material, silicon nitride for example. The thickness of the layer 27 is for example comprised between 30 and 50 nm and is for example 40 nm. The layer 27 is covered with another layer 28 of insulator, silicon oxide for example. The layer 28 covers all the structure and in particular the gates of the transistors. The upper surface of the layer 28 has been planarized. The layer 28 for example has a thickness of approximately 150 nm.

FIG. 2B is a cross-sectional view of the three SOI transistors of FIG. 1 after a step subsequent to that the result of which is described with reference to FIG. 2A. The aim of this step is to uncover the source zones 16, in order that it be possible to electrically connect them with the conductive strip 25.

In this step, a trench is formed in the layer 28 of insulator down to the etch-stop layer 27, in the location where it is desired to form the connecting bar 25. The etch-stop layer 27 is then removed from the bottom of the trench so as to uncover the source zones 16 to be connected. The trench is then completely filled with a conductive metal, tungsten for example, forming the conductive strip 25.

The etching of the etch-stop layer 27 is continued until all the material of this layer has been completely removed from above the source zones 16 to be connected. The selectivity of the etching of the insulator 22, generally silicon oxide, with respect to the etching of the material of the layer 27 being low, this insulator 22 is in practice partially etched. Thus, portions 30 of the silicon wafer 20 may be uncovered by the etching. When the trench is filled with a conductor, tungsten for example, the conductor makes contact with the wafer 20, creating, level with regions 30, short-circuits between the sources of the transistors and the silicon of the wafer 20. It is these short-circuits that it is desired to prevent by means of the process described below.

Figure 3:
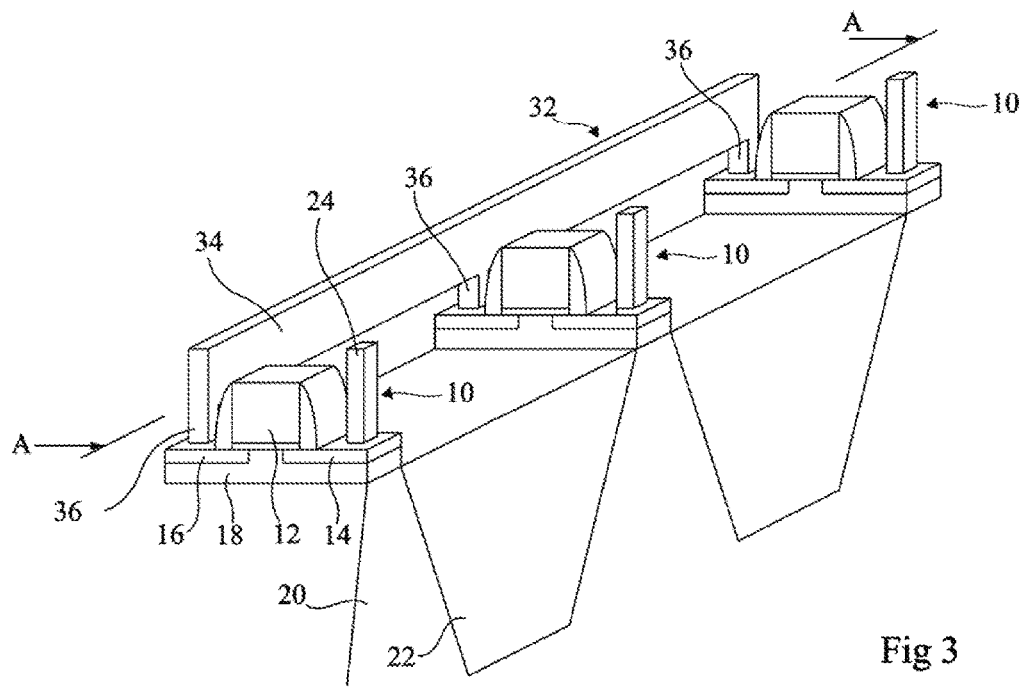
FIG. 3 is a partial schematic perspective view of one embodiment of a connecting bar.

FIG. 3 is a perspective view of one embodiment of a connecting bar allowing short-circuits between the connecting bar and the silicon wafer 20 to be prevented. The elements of FIG. 3 are similar to the elements of FIG. 1, except that the connecting bar 25 has been replaced in FIG. 3 by a connecting bar 32. The bar 32 comprises a main portion 34 and secondary portions 36.

The main portion 34 is a vertical conductive strip formed above the zones to be connected, here the source zones 16. The main portion 34 is formed in a layer of insulator, which layer is not shown in FIG. 3.

The secondary portions 36 are conductive pads that pass through the insulator (not shown) and that form a connection between the main portion and only the source zones to be connected. The bar 32 comprises as many secondary portions 36 as there are source zones 16 to be connected. In FIG. 3, three source zones and therefore three secondary portions 36 are shown. It will be noted that the secondary portions 36 are similar to the connecting pads 24 of the drain zones: they have identical or similar cross sections but smaller heights.

The connecting bar 32, i.e. the main portion 34 and the secondary portions 36, is made of a single metal, tungsten for example.

Figure 4A:
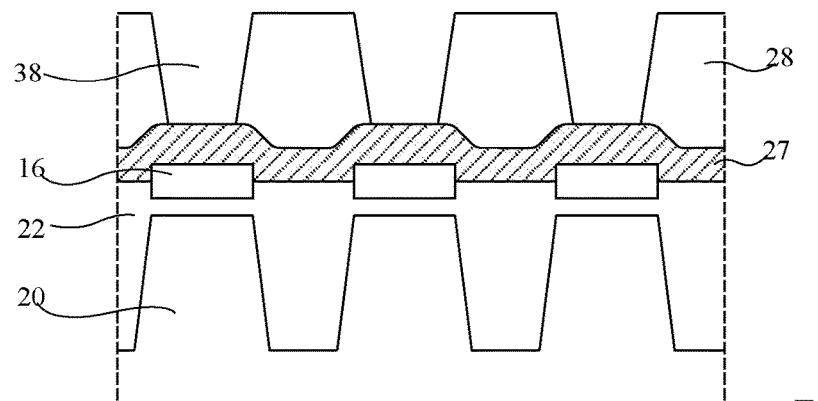
FIGS. 4A to 4C are cross-sectional views illustrating steps of one embodiment of a process for fabricating a connecting bar.
Figure 4B:
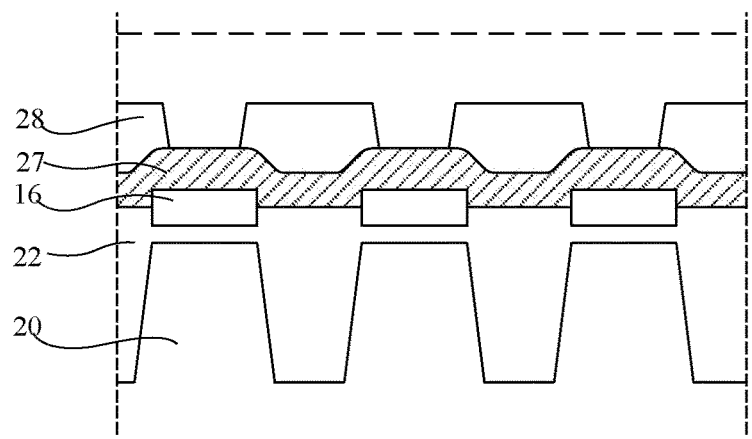
Figure 4C:
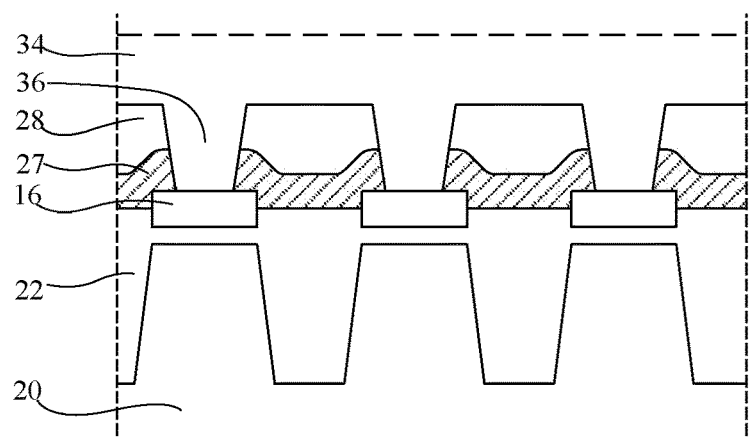

FIGS. 4A to 4C are cross-sectional views of steps of one embodiment of a process for fabricating the connecting bar 32.

FIG. 4A illustrates the result of a fabricating step subsequent to that the result of which was described with reference to FIG. 2A. Elements that are the same as those in FIG. 2A have been referenced by the same references and will not be described again.

In this step, first apertures 38 are formed in the layer 28 facing the zones to be connected. These apertures have a smaller extent than that of the source region to be connected.

Only then, as is shown in FIG. 4B, is a longitudinal trench having the complementary shape of that of the connecting bar 34 to be formed etched.

In the step illustrated in FIG. 4C, the material of the etch-stop layer is selectively etched down to the source zone 16 to be reached. It will be noted that this step of selectively etching the layer 27, which is commonly made of silicon nitride, may be carried out after the step of FIG. 4B or after the step of FIG. 4A. Even though the etching of the silicon nitride 27 is not perfectly selective, given the shape of the apertures formed, it will not be possible to etch the insulator 22 and reach the silicon wafer 20. Thus, the aforementioned risk of short-circuit is avoided. Next, the trenches are filled with a conductor, commonly tungsten separated from the walls of the trenches by a metal barrier layer (not shown), in order to form the pads 36 and the conductive strip 34.

Figure 5:
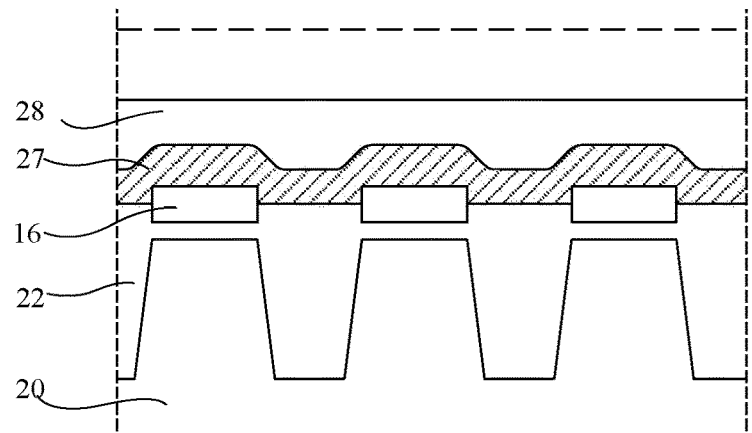
FIG. 5 is a cross-sectional view illustrating a step of another embodiment of a process for fabricating a connecting bar.

The present invention has many variants. For example, as FIG. 5 shows, the strip-shaped aperture for receiving the conductive strip 34 may be formed before the apertures (not yet formed in the step in FIG. 5) intended to receive the pads 36.

Particular embodiments have been described. Various variants and modifications will seem obvious to those skilled in the art. In particular, the connecting bar is here used to connect source zones. It may also be used to connect other transistor zones, for example the drain zones, or other types of component.

It will be within the ability of those skilled in the art to combine various elements of the embodiments described above without exercising inventive skill.

The invention claimed is:

1. An apparatus, comprising:
an integrated circuit including separate first circuit zones to be interconnected;
an insulating layer covering the integrated circuit and having a planar upper surface;
a main opening extending into the insulating layer from said planar upper surface and having a depth less than a thickness of the insulating layer;
a plurality of secondary openings extending into the insulating layer from the depth of said main opening to pass completely though the insulating layer to said separate first circuit zones; and
a connecting bar consisting of:
a main portion formed by a conductive strip in said main opening extending above said separate first circuit zones, the conductive strip being separated from the integrated circuit by the insulating layer except at the separate first circuit zones to be interconnected; and
secondary portions formed by first conductive pads in said plurality of secondary openings, each of the first conductive pads extending vertically from one first circuit zone to the conductive strip.

2. The apparatus according to claim 1, wherein the separate first circuit zones to be interconnected are source or drain zones of transistors of the integrated circuit.

3. The apparatus according to claim 2, wherein the integrated circuit further includes separate second circuit zones, and further comprising second conductive pads for connecting to the separate second circuit zones, wherein a height of the first conductive pads is smaller than a height of the second conductive pads.

4. The apparatus according to claim 3, wherein a top of the conductive strip is coplanar with a top of the second conductive pads.

5. The apparatus according to claim 1, wherein the conductive strip and the first conductive pads are made of tungsten.

6. A process for fabricating a connecting bar, comprising:
   a) forming in an insulator layer a main cavity extending above circuit zones to be interconnected, said main cavity having a depth less than a thickness of the insulator layer and being separated from the circuit zones to be interconnected by a lower portion of the insulator layer;
   b) forming secondary cavities in said insulator layer, each secondary cavity extending vertically into the lower portion of said insulator layer from the depth of the main cavity to one of the circuit zones to be interconnected; and
   c) filling the main and secondary cavities with a conductor material to form said connecting bar.

7. The process according to claim 6, wherein step a) is carried out before step b).

8. The process according to claim 6, wherein step a) is carried out after step b).

9. The process according to claim 6, wherein step b) forming secondary cavities comprises: a first step of etching through the lower portion of the insulator layer to reach an underlying etch-stop layer over the circuit zone; and a second step of etching the etch-stop layer with the pattern of said secondary cavities.

10. An apparatus, comprising:
    a semiconductor substrate including separate zones forming source or drain regions of a plurality of transistors;
    a unitary layer made of an insulating material covering the semiconductor substrate and having a planar upper surface, wherein the unitary layer includes:
       a main opening extending into the unitary layer from said planar upper surface and having a depth less than a thickness of the unitary layer; and
       a plurality of secondary openings extending into the unitary layer from the depth of said main opening to pass completely though the unitary layer to said separate zones; and
    a connecting bar made of a unitary body of metal material including:
       a main portion of the unitary body located in said main opening; and
       a plurality of secondary portions located in said plurality of secondary openings and in electrical connection to said separate zones.

11. The apparatus according to claim 10, further including:
    a plurality of additional zones; and
    a plurality of conductive pads for connecting to the plurality of additional zones, wherein a height of the plurality of secondary portions is smaller than a height of the plurality of conductive pads.

12. The apparatus according to claim 11, wherein a top surface of the main portion is coplanar with a top of the plurality of conductive pads and the planar upper surface of the unitary layer.

13. The apparatus according to claim 10, wherein the metal material of the unitary body is tungsten.

14. A process, comprising:
    depositing a unitary layer made of an insulating material to cover a semiconductor substrate which includes separate zones forming source or drain regions of a plurality of transistors, the unitary layer having a planar upper surface;
    forming a connecting bar opening in the unitary layer, said connecting bar opening including:
       a main opening extending into the unitary layer from said planar upper surface and having a depth less than a thickness of the unitary layer; and
       a plurality of secondary openings extending into the unitary layer from the depth of said main opening to pass completely though the unitary layer to said separate zones; and
    filling the main and secondary openings with a metal material to form a unitary body electrically connecting said separate zones.

15. The process according to claim 14, wherein forming comprises producing the main opening before producing the secondary openings.

16. The process according to claim 14, wherein forming comprises producing the secondary openings before producing the main opening.

17. The process according to claim 14, further comprising depositing an etch-stop layer before depositing the unitary layer made of an insulating material, and wherein forming the connecting bar opening comprises extending the plurality of secondary openings through the etch stop layer.

* * * * *